(12) United States Patent
Joshi et al.

(10) Patent No.: US 7,087,537 B2
(45) Date of Patent: Aug. 8, 2006

(54) METHOD FOR FABRICATING OXIDE THIN FILMS

(75) Inventors: Pooran Chandra Joshi, Vancouver, WA (US); Apostolos T. Voutsas, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 72 days.

(21) Appl. No.: 10/801,374

(22) Filed: Mar. 15, 2004

(65) Prior Publication Data

US 2005/0202662 A1      Sep. 15, 2005

(51) Int. Cl.
*H01L 21/26*     (2006.01)
*H01L 21/469*    (2006.01)

(52) U.S. Cl. ............... 438/778; 438/788; 438/787; 438/792; 438/798

(58) Field of Classification Search .......... 438/788, 438/798, 787, 792, 778
See application file for complete search history.

(56) References Cited

U.S. PATENT DOCUMENTS

| | | | |
|---|---|---|---|
| 6,514,865 B1 * | 2/2003 | Evans | 438/710 |
| 6,689,646 B1 * | 2/2004 | Joshi et al. | 438/149 |
| 6,716,740 B1 * | 4/2004 | Wang et al. | 438/622 |
| 2002/0100554 A1 * | 8/2002 | Han et al. | 156/345.1 |

OTHER PUBLICATIONS

J. Y. Zhang and I.W. Boyd, Appl. Phys. Lett., 71, 2964 (1997).

* cited by examiner

*Primary Examiner*—Hsien-Ming Lee
(74) *Attorney, Agent, or Firm*—Law Office of Gerald Maliszewski; Gerald Maliszewski (57) ABSTRACT

A method for fabricating a thin film oxide is provided. The method includes: forming a substrate; treating the substrate at temperatures equal to and less than 360° C. using a high density (HD) plasma source; and forming an M oxide layer overlying the substrate where M is an element selected from a group including elements chemically defined as a solid and having an oxidation state in a range of +2 to +5. In some aspects, the method uses an inductively coupled plasma (ICP) source. In some aspects the ICP source is used to plasma oxidize the substrate. In other aspects, HD plasma enhanced chemical vapor deposition is used to deposit the M oxide layer on the substrate. In some aspects of the method, M is silicon and a silicon layer and an oxide layer are incorporated into a TFT.

19 Claims, 5 Drawing Sheets

METHOD FOR FABRICATING OXIDE THIN FILMS

BACKGROUND OF THE INVENTION

1. Field of the Invention

This invention generally relates to integrated circuit (IC) and liquid crystal display (LCD) fabrication processes and, more particularly to an oxide thin film fabrication method using high-density plasma.

2. Description of the Related Art

Binary and multi-component oxides are used in numerous applications, such as electronic, optical, and electro-chemical, to exploit their micro structural, optical, and electrical properties. For example, the proper performance of IC devices depends, in part, on the characteristics of oxide gate insulator layers. Oxide film properties are dependent upon fabrication techniques, since these techniques influence bulk and interface characteristics of the film.

Currently, a number of conventional physical and chemical techniques are used for the growth or deposition of oxide thin films on substrates. For example, thin films can be grown on a suitable substrate in an oxidizing atmosphere or can be deposited directly on a substrate by transporting reactive species from a source to the substrate. For the above mentioned techniques, a critical factor controlling oxide growth or deposition and hence, the properties of the resulting oxides, is the energy state of reactive oxygen species available during processing. The bond energy of $O_2$ is 5.1 electron-volts (eV). Therefore, to dissociate $O_2$ molecules and selected precursors, thereby generating reactive oxygen species, a growth or deposition technique must supply an electron temperature/ion energy distribution covering the 5.1 eV noted above.

Conventional physical and chemical techniques, such as thermal oxidation or plasma enhanced chemical vapor deposition (PECVD), obtain the necessary electron temperature/ion energy distribution by providing thermal energy to the substrate and/or by creating reactive species in a plasma medium. For example, thermal oxidation obtains the necessary electron temperature/ion energy distribution by providing high thermal energy to a substrate and diffusing oxygen molecules into the substrate, thereby creating an oxide layer on the substrate surface. Thermal oxidation requires high temperatures to achieve practical growth rates. For example, temperatures of at least 800° C. are required to produce practical growth rates of silicon dioxide ($SiO_2$) on Si substrates.

The use of temperature sensitive materials, that is, materials damaged by temperatures over 400° C., as substrates for oxide films is of increasing interest. Temperature sensitive materials include transparent materials such as glass or polymer and flexible materials such as plastic. Unfortunately, since thermal oxidation requires temperatures of at least 800° C., thermal oxidation is unsuitable for temperature sensitive materials. Other conventional physical and chemical techniques can grow or deposit oxides at temperatures below 400° C., hereafter referred to as low temperatures, by properly choosing precursors and energy sources. Unfortunately, conventional plasma based physical and chemical techniques do not control plasma energy and density independently. Thus, these conventional techniques have limited control of film growth and deposition kinetics. Consequently, the bulk and interfacial properties of the deposited films are degraded. In addition, typical low temperature deposition rates are not economically feasible.

Figure 1:
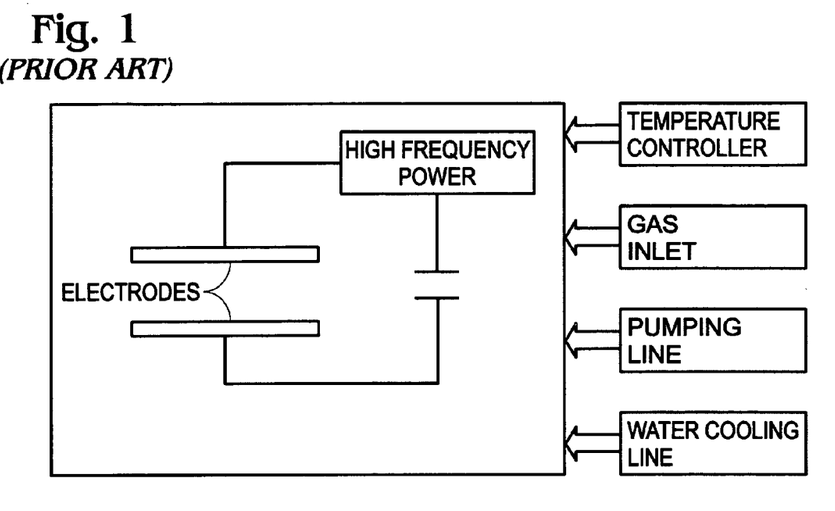
FIG. 1 is a schematic drawing of a PECVD system (prior art).

FIG. 1 is a schematic drawing of a PECVD system (prior art). Unfortunately, modifying low temperature PECVD process parameters to increase deposition rates further reduces the quality of the bulk and interface characteristics for the resulting oxide. The system shown in FIG. 1 can be used to illustrate this point. The system in FIG. 1 uses capacitively coupled plasma. That is, high frequency power is directly connected to the top electrode and capacitively coupled to the bottom electrode. Since the two electrodes are coupled, it is not possible to independently control energy directed to the top and bottom electrodes. Unfortunately, this lack of energy control results in the reduction of quality for the resulting oxide. For example, increasing the high frequency power to accelerate the oxide growth rate leads to an increase in sheath potential, adversely affecting bulk and interface properties for the resulting oxide.

It would be advantageous if a low temperature deposition or growth process could form binary or multi-component oxide layers with bulk and interface characteristics superior to binary and multi-component oxide layers formed by conventional low temperature methods such as PECVD.

It would be advantageous if a low temperature deposition or growth process could form binary or multi-component oxide layers with bulk and interface characteristics approaching those for thermal oxide.

It would be advantageous if a low temperature deposition or growth process could deposit binary or multi-component oxide at rates greater than those for conventional low temperature methods such as PECVD.

It would be advantageous if a low temperature deposition or growth process could independently control plasma energy and density to improve bulk and interfacial properties for resulting binary and multi-component oxide thin films.

SUMMARY OF THE INVENTION

The present invention describes a process that yields an oxide thin film interface, fabricated at temperatures equal to and less than 360° C. The interface has bulk and interface characteristics approaching those of bulk oxide. The present invention is accomplished using a high-density (HD) plasma source to grow or deposit the oxide thin films. The present invention allows the formation of integrated circuit (IC) devices, such as thin film transistors (TFTs), on transparent substrates, such as glass and polymer or flexible substrates, such as plastic.

Accordingly, a method is provided for fabricating thin film oxides. The method includes: forming a substrate; treating the substrate at temperatures equal to and less than 360° C., using a high density (HD) plasma source; and forming an M oxide layer overlying the substrate, where M is selected from a group including elements chemically defined as a solid and having an oxidation state in a range of +2 to +5. In some aspects, the method uses an inductively coupled plasma (ICP) source. In some aspects the ICP source is used to plasma oxidize the substrate. In other aspects, HD plasma enhanced chemical vapor deposition is used to deposit the M oxide layer. The plasma oxidation and deposition processes are performed at specified parameters including power density, pressure, process gas composition, and process gas flow. In some aspects of the method, M is silicon and a silicon layer and an M oxide layer are incorporated into a TFT by forming a transparent substrate layer, overlying the substrate with a diffusion barrier, and overlying the diffusion barrier with the silicon layer. Then, transistor channel, source, and drain regions are formed in the silicon layer, the oxide layer forms a gate dielectric layer, and a gate electrode overlying the gate dielectric layer is formed.

Additional details of the above-described method are presented in detail below.

DETAILED DESCRIPTION OF THE PREFERRED EMBODIMENTS

Figure 2:
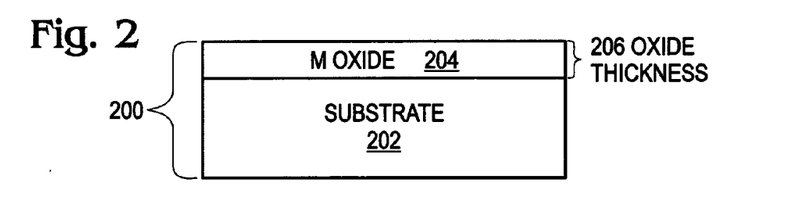
FIG. 2 is a partial cross-sectional view of a general thin film oxide interface produced by the present invention method.

FIG. 2 is a partial cross-sectional view of a general thin film oxide interface produced by the present invention method.

Figure 3:
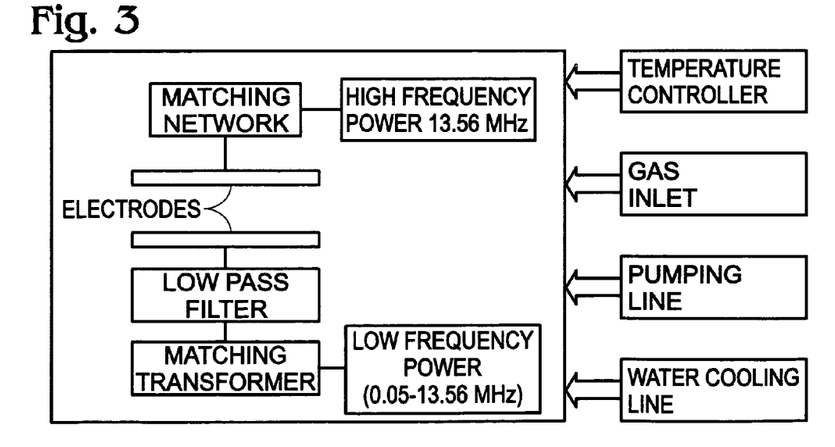
FIG. 3 is a schematic drawing of a high-density plasma enhanced chemical deposition (HD-PECVD) system employing an inductively coupled plasma (ICP) source.

FIG. 3 is a schematic drawing of a high-density plasma enhanced chemical deposition (HD-PECVD) system employing an inductively coupled plasma (ICP) source. The following should be considered in light of FIGS. 2 and 3. FIG. 2 shows the general case of a thin film oxide interface produced by the present invention method. An M oxide interface 200 consists of a substrate 202 overlain by an M oxide layer 204 with a thickness 206. The M oxide layer 204 is formed by treating substrate 202 at temperatures equal to and less than 360° C. using an HD plasma source. For FIG. 2, the type of treatment is unspecified, however, further description of treatment methods is provided below. It is understood that 360° C. is chosen as a general or average case. Depending on process parameters, some portions of substrate 202 or oxide layer 204 could be at temperatures greater than 360° C. A system with an ICP plasma source, for example, the system shown in FIG. 3, is described for the examples that follow. However, it is understood that the invention method is not limited to ICP plasma sources. Other HD plasma sources, for example, an electron cyclotron resonance (ECR) system or a cathode-coupled system (not shown) also can be used.

There are two criteria for an element M: the element is chemically defined as a solid at room temperature (approximately 20° C.) and at a pressure of one-atmosphere; and the element has an oxidation state in a range of +2 to +5. The aforementioned criteria are chosen to produce an M oxide layer 204 with desired characteristics. For example, zinc, a solid element with an oxidation state of +2, produces zinc oxide (ZnO) when properly oxidized. ZnO is useful for fabricating surface acoustic wave (SAW) devices. Silicon is a solid element with an oxidation state of +4. When properly oxidized, silicon produces silicon dioxide ($SiO_2$), which has numerous uses in electrical applications, for example, as a dielectric layer in integrated circuit (IC) devices. Typical forms of silicon include, but are not limited to, amorphous silicon, microcrystalline silicon, and polycrystalline silicon. Other examples of M from the Periodic Table of the Elements include the elements in column 4a and the elements in the first three rows of transition elements. M oxide layer 204 can be a binary oxide or a multi-component oxide.

Figure 4A:
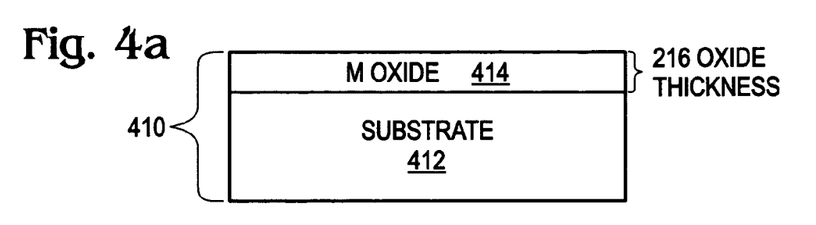
FIG. 4a is a partial cross-sectional view of a thin film oxide interface produced by the present invention method using plasma oxidation.

FIG. 4a is a partial cross-sectional view of a thin film oxide interface produced by the present invention method using plasma oxidation. The following discussion should be considered in light of FIGS. 3 and 4a. In FIG. 4a, the M oxide interface 410 includes a substrate 412 overlain by an M oxide layer 414 with a thickness 416. The substrate 412 is made of an element M. The M oxide layer 414 is formed by plasma oxidizing the substrate 412 using an ICP plasma source, for example, the HD-PECVD system shown in FIG. 3.

Figure 4B:
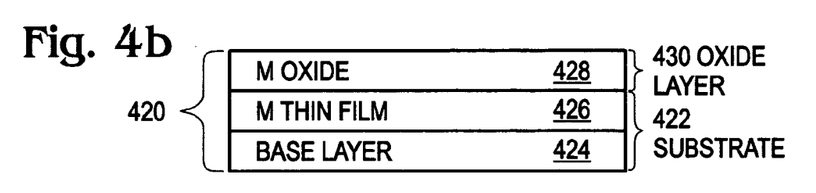
FIG. 4b is a partial cross-sectional view of a thin film oxide interface produced by the present invention method using plasma oxidation.

FIG. 4b is a partial cross-sectional view of a thin film oxide interface produced by the present invention method using plasma oxidation. The following discussion should be considered in light of FIGS. 3 and 4b. In FIG. 4b, an M oxide interface 420 includes a substrate 422 with a base layer 424 overlain by an M thin film 426. The thin film 426 is overlain by an M oxide layer 428 with a thickness 430. Thickness 430 is typically less than 1000 angstroms (A). The film 426 can be deposited by any physical or chemical thin film deposition known in the art including chemical vapor deposition (CVD), plasma enhanced CVD (PECVD), electron cyclotron resonance PECVD (ECR-PECVD), inductively coupled plasma PECVD (ICP-PECVD), photo PECVD, sputtering (examples include, but are not limited to radio frequency (RF), direct current, ion-assisted, or cathode-coupled),electron beam, atomic layer deposition (ALD), radical oxidation, and HD-PECVD. Following the deposition of the thin film 426, the thin film 426 is plasma oxidized using an ICP plasma source, for example, the HD-PECVD system shown in FIG. 3 to produce the oxide layer 428. Oxide layers less than 1000 A thick are particularly useful for fabrication of electronic components, such as capacitors, and in optical applications.

Figure 4C:
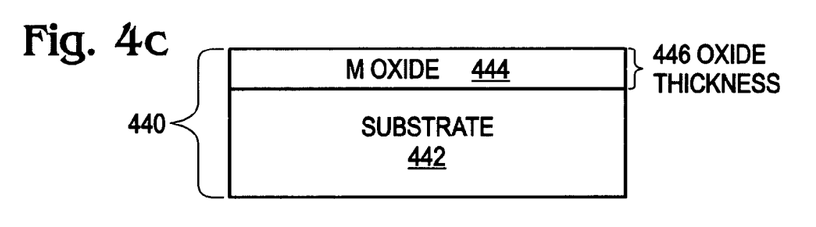
FIG. 4c is a partial cross-sectional view of a thin film oxide interface produced by the present invention method using oxide deposition.

FIG. 4c is a partial cross-sectional view of a thin film oxide interface produced by the present invention method using oxide deposition. The following discussion should be considered in light of FIGS. 3 and 4c. M oxide interface 440 includes a substrate 442, formed from a suitable material, overlain with M oxide layer 444. Oxide layer 444 has a thickness 446. Suitable substrate materials include, but are not limited to, metal semi-conductors, ceramics, glass, polymer, and plastic. These materials can be selected in accordance with the desired application for the interface 440. Substrate types are further discussed below. An ICP plasma source, for example, the HD-PECVD system shown in FIG. 3 can be used to deposit the oxide layer 444. Any suitable physical or chemical deposition technique, for example, the techniques noted in the description for FIG. 4b can be used to deposit layer 444.

For a deposition process, the type of M oxide produced is a function of the precursor gases used. In general, the precursor gases are a mixture of reactive gases and precursor compounds having M in a decomposable form. The gases and precursor compounds are combined in a ratio selected in accordance with the valence state of M. For example, to deposit $SiO_2$, silane, tertraethoxy silane, and other silicon-containing compounds are suitable precursors. Elemental oxygen ($O_2$), ozone ($O_3$), and nitrogen oxide ($N_2O$) can be used for the oxidizing gas. Other gases can be added to a precursor gas to impart desired characteristics to the resulting oxide. For example, to incorporate nitrogen and fluorine into the oxide layer 444, suitable precursors containing these elements can be used, such as, elemental nitrogen, fluorocarbons, or ammonia.

Returning to FIG. 2, forming M oxide layer 204 at temperatures less than and equal to 360° C. enables the use of transparent or flexible substrates with the oxide interface 200. Such substrates are incompatible with the temperatures typically associated with thermal oxidation (800° C. to 1200° C.) and conventional physical and chemical deposition processes (greater than 360°). A transparent substrate can be glass or polymer, but is not limited to these materials. A flexible substrate, in comparison to typical substrates such as silicon or glass, can be plastic, but is not limited to plastic. A transparent substrate facilitates the use of the M oxide interface 200 in display devices, such as devices with liquid crystal displays (LCDs). In some aspects, the substrate 202 can be a transparent or flexible material. In some aspects, the substrate 202 is composed of a rigid material, for example, silicon, and overlies a transparent or flexible layer.

Bulk characteristics quantify the physical composition of M oxide layer 204, while interface characteristics measure the electrical performance of M oxide layer 204, for example, in an IC device. Depending on the thickness 206, M oxide layer 204 generally has bulk and electrical characteristics approaching those for bulk M oxide. For those aspects in which M is silicon, oxide layer 204 has bulk and electrical characteristics approaching those for thermal silicon oxide. The following discussion applies to those aspects in which M is silicon. At thicknesses 206 greater than approximately 10 nanometers (nm), layer 204 has a refractive index value (a bulk characteristic) between approximately 1.45 and 1.47. As a comparison, thermal silicon oxide typically has a refractive index value of 1.46. Interface characteristics for M oxide layer 204, for example, the flat-band voltage shift, leakage current density, and breakdown field strength are approximately of the same order as those for thermal oxide, as further described below.

In some aspects, thickness 206 is more than 20 nm. In some aspects, thickness 206 is less than 20 nm. In the latter aspects, the M oxide layer 206 is particularly well suited for use in applications requiring thin layers, for example IC applications. As noted above, M oxide layer 204 can be a binary oxide or a multi-component oxide. In those aspects where M is silicon, oxide layer 204 can be silicon oxide or silicon oxynitride. It is understood, however, that layer 204 is not limited to these materials.

Figure 5:
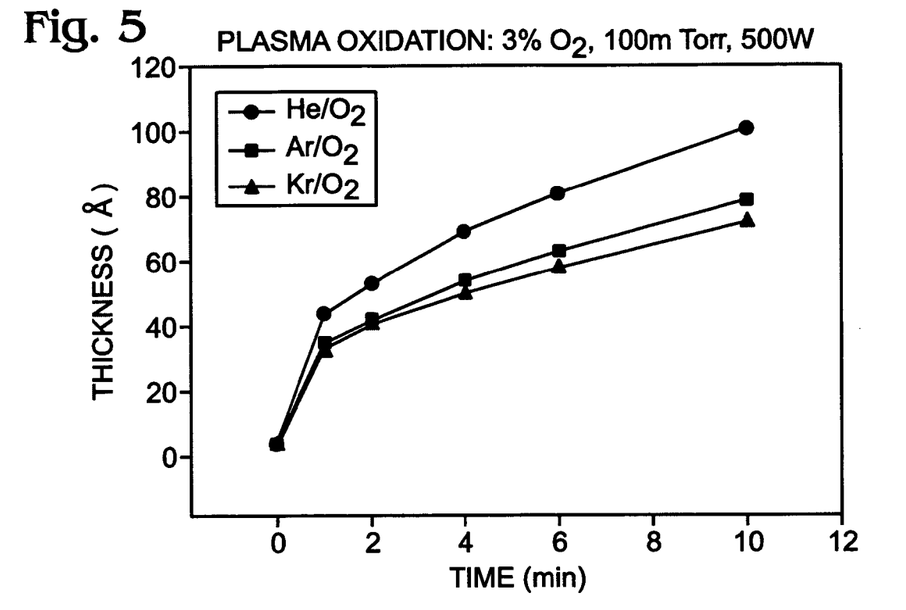
FIG. 5 shows $SiO_2$ plasma oxidation rates for various inert gas atmospheres at 360° C.

FIG. 5 shows $SiO_2$ plasma oxidation rates for various inert gas atmospheres at 360° C. The following should be considered in light of FIGS. 4a, 4b, and 5. In some aspects, M is silicon. Then, as shown in FIG. 5, in some aspects, M oxide layers 412 and 430 reach a thickness of about 70 to 100 A in the first ten minutes of oxidation at temperatures of 350° C. This initial rate of growth is faster than the growth rate for thermal oxide at 1000° C.

In some aspects, thickness 446 is up to 100 nm. However, the thickness 446 is not limited to 100 nm for deposition oxide. 100 nm is chosen to illustrate a typical thickness 446 for IC devices, for example, a thin film transistor (TFT) (not shown), incorporating an oxide interface 440.

Functional Description

The present invention method for producing an M oxide thin film interface uses a high-density (HD) plasma source operating at substrate temperatures at or below 360° C. In some aspects, the HD plasma source is an inductively coupled plasma (ICP) source. In some aspects, the HD plasma source is an electron cyclotron resonance (ECR) plasma source. The HD plasma source is used to plasma oxidize a substrate or deposit an M oxide on a substrate. The plasma oxidation aspects of the present invention method produce high quality M oxide layers at growth rates significantly higher than those for conventional thermal oxides.

The present invention method is an in-situ process. In those aspects where M is silicon, the present invention method can form gate oxide layers for thin film transistors (TFTs) and other integrated circuit (IC) applications. Operating the HD plasma source at substrate temperatures at or below 360° C. (hereafter referred to as low temperature) permits the possibility of integration on transparent substrates such as glass or polymer and flexible substrates such as plastic. In addition, for IC device manufacturing, the present invention method can significantly reduce the thermal budget and increase device throughput.

The present invention can use the HD plasma enhanced chemical vapor deposition (HD-PECVD) system configuration shown in FIG. 3 for both plasma oxidation and deposition of M oxide thin films. The use of the HD-PECVD system configuration allows the electrodes in FIG. 3 to be decoupled, resulting in low self-bias at the substrate. Thus, the HD-PECVD system configuration permits independent control of plasma ion/electron density and energy to enhance both film growth rate and bulk and interface properties.

The M oxides formed by the present invention method have better bulk and interface characteristics and fewer impurities than M oxides produced by conventional processes at or below 360° C. For example, as noted in the Background Section, where M is silicon, thermal oxidation produces an oxide with good bulk and interface characteristics. However, thermal $SiO_2$ growth rates are impractical at temperatures below 800° C. As shown in FIG. 5, the present invention high-density plasma oxidation of silicon has shown growth rates of approximately 70 to 100 angstroms (A) in the first ten minutes. The plasma oxidation growth rate is significantly higher than the growth rate for thermal oxidation at 1000° C.

The HD-PECVD process is effective in minimizing impurities incorporated in the films during deposition at low processing temperatures, as well as, impurity related bonds in the films. This is possible because plasma density and energy levels are higher for the HD-PECVD process than those for conventional PECVD processes.

Figure 6:
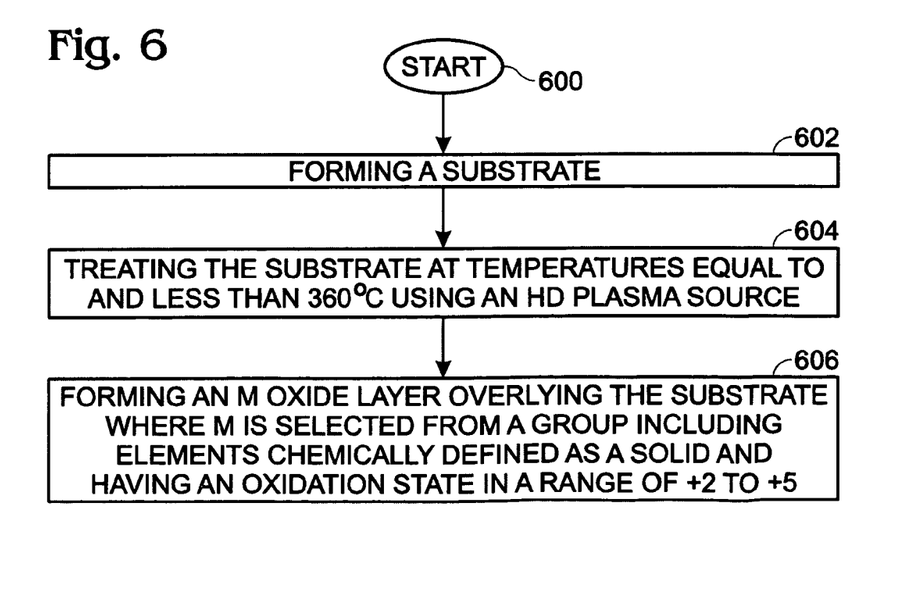
FIG. 6 is a flowchart illustrating the present invention method for fabricating M oxide thin films.

FIG. 6 is a flowchart illustrating the present invention method for fabricating M oxide thin films. Although the method in FIG. 6 (and FIGS. 7, 8, 9, and 10 below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 600. Step 602 forms a substrate. Step 604 treats the substrate at temperatures equal to and less than 360° C. using an HD plasma source. Step 606 forms an M oxide layer overlying the substrate where M is selected from a group including elements chemically defined as a solid and having an oxidation state in a range of +2 to +5.

In some aspects of the invention, forming a substrate in Step 602 includes forming a substrate of silicon selected from the group including amorphous silicon, microcrystalline silicon, and polycrystalline silicon. In some aspects of the invention, treating the substrate at temperatures equal to and less than 360° C. using an HD plasma source in Step 604 includes using an ICP source. In some aspects, treating the substrate in Step 604 includes plasma oxidizing the substrate or treating the substrate with a deposition technique. In some aspects of the invention, treating the substrate in Step 604 includes using an ECR plasma source. In some aspects of the invention, forming an M oxide layer in Step 606 includes forming an M oxide selected from the group including M binary oxides and M multi-component oxides.

Figure 7:
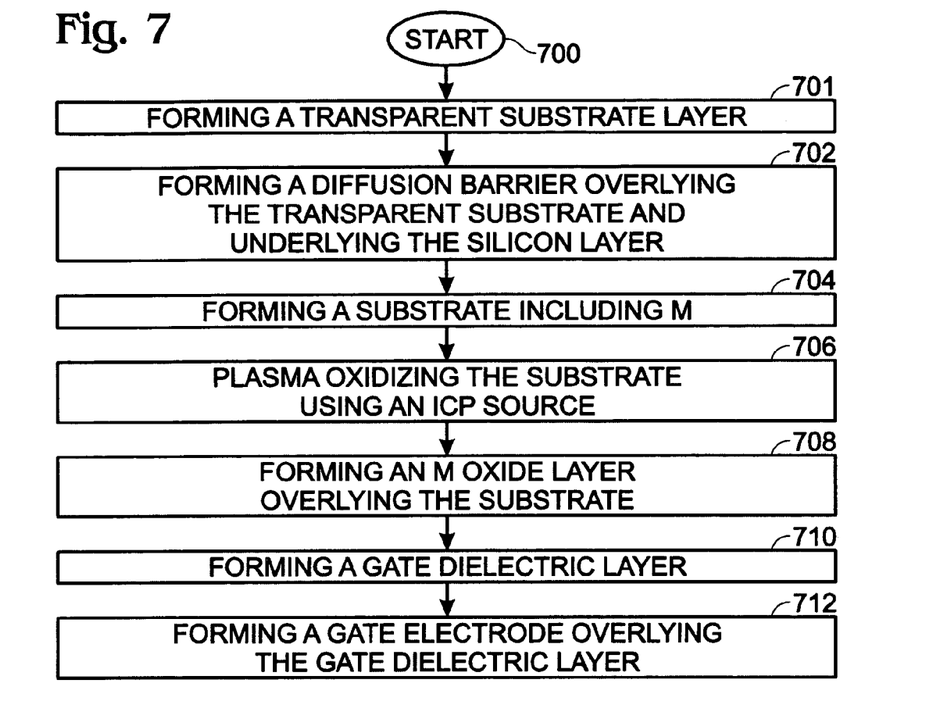
FIG. 7 is a flowchart illustrating additional details of the method shown in FIG. 6.

FIG. 7 is a flowchart illustrating additional details of the method shown in FIG. 6. The method starts with Step 700. Step 704 forms a substrate including M. Step 706 plasma oxidizes the substrate using an ICP source. Step 708 forms an M oxide layer overlying the substrate.

In some aspects of the invention, forming a substrate in Step 704 includes: forming a base layer of a material; and depositing, overlying the base layer, a thin film of M. Then, plasma oxidizing the substrate in Step 706 includes plasma oxidizing the M thin film.

In some aspects of the invention, plasma oxidizing the substrate in Step 706 includes inductively coupling plasma: at a temperature of 360° C.; in a range of 13.56 to 300 megahertz (MHz) with a power density up to 10 watts per square centimeter (W/cm$^2$); at a pressure of up to 500 milliTorr (mTorr); with a mixture of inert gas and oxygen in a ratio of approximately 10:1 to 200:1; and with a total gas flow of approximately 50 to 200 standard cubic centimeters per minute (sccm).

In some aspects, inductively coupling plasma includes varying a substrate bias in a range of 50 kilohertz (KHz) to 13.56 MHz with a power density up to 3 W/cm$^2$. In some aspects, inductively coupling plasma with a mixture of inert gas and oxygen includes mixing oxygen with inert gas selected from the group including helium, argon, and krypton.

In some aspects, forming a substrate including M in Step 704 includes forming a silicon layer. Then, in some aspects of the invention, forming an M oxide layer in Step 708 includes forming a silicon oxide layer with a refractive index between approximately 1.45 and 1.47.

The following describes one possible sequence for forming a TFT using the present invention method. It is understood that other sequences also are possible for FIG. 7. For the following sequence, M is silicon. Step 701 forms a transparent substrate layer. Step 702 forms a diffusion barrier overlying the transparent substrate and underlying the silicon layer. Then, forming a silicon layer includes forming transistor channel, source, and drain regions in the silicon layer. Step 710, following the forming of an M oxide layer overlying the substrate in Step 708, forms a gate dielectric layer with: a fixed oxide charge density of less than $5 \times 10^{11}$ per square centimeter (/cm$^2$); an interface trap concentration of approximately $0.9 \times 10^{10}$ to $8 \times 10^{10}$ per square centimeter-electron volt (/cm$^2$ eV); a flat band voltage shift of less than 1 V; a leakage current density lower than $10^{-7}$ amperes per square centimeter (A/cm$^2$) at an applied electric field of 8 megavolts per centimeter (MV/cm); and a breakdown field strength greater than 10 MV/cm. Step 712 forms a gate electrode overlying the gate dielectric layer.

Figure 8:
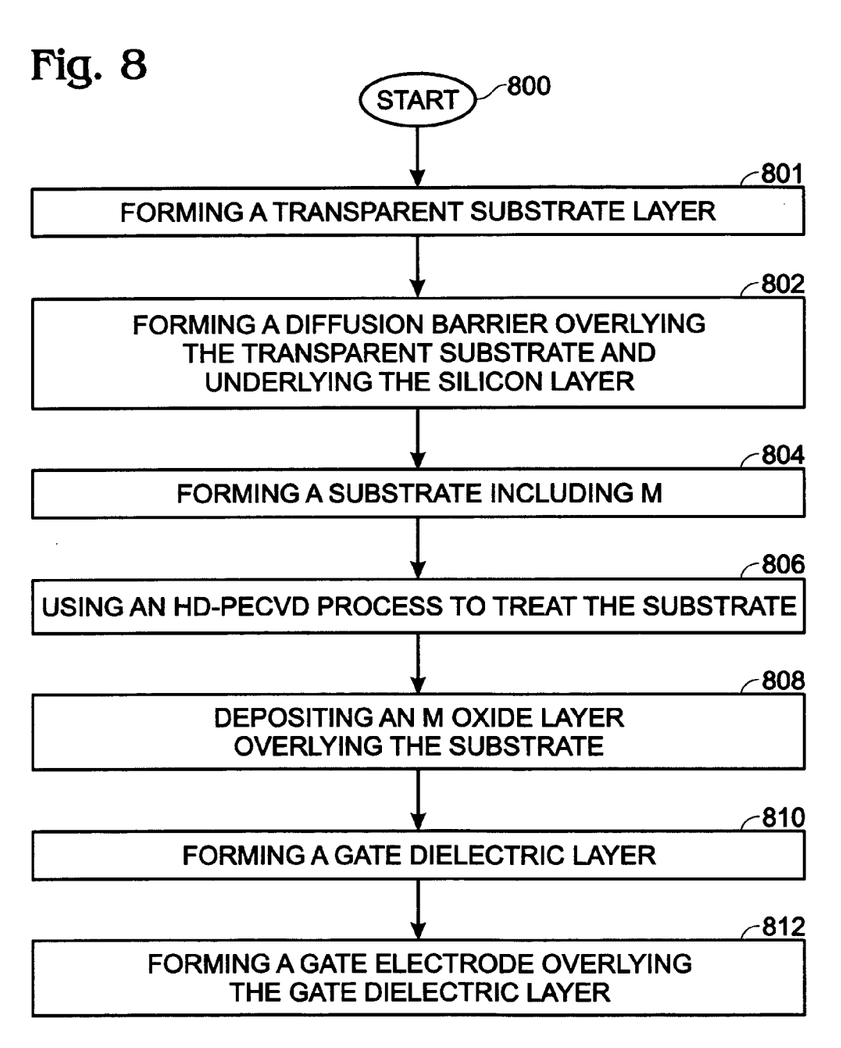
FIG. 8 is a flowchart illustrating additional details of the method shown in FIG. 6.

FIG. 8 is a flowchart illustrating additional details of the method shown in FIG. 5. The method starts with Step 800. Step 804 forms a substrate. Step 806 uses an HD-PECVD process to treat the substrate. Step 808 deposits an M oxide layer overlying the substrate.

In some aspects, using an HD-PECVD process to treat the substrate in Step 806 includes inductively coupling plasma: in a range of 13.56 to 300 MHz with a power density up to 10 W/cm$^2$; at a pressure of up to 500 mTorr; and with a mixture of reactive gases and precursor compounds having M in a decomposable form, the gases and precursor compounds in a ratio selected in accordance with the valence state of M. In some aspects, inductively coupling plasma includes varying a substrate bias in a range of 50 KHz to 13.56 MHz with a power density up to 3 W/cm$^2$.

In some aspects of the invention, forming a substrate in Step 804 includes forming a silicon layer. Then, inductively coupling plasma with a mixture of reactive gases and precursor compounds includes inductively coupling plasma with a mixture of $SiH_4$, $N_2O$, and $N_2$ gases in a ratio of approximately 10:100:50 to 25:100:50. Also then, in some aspects of the invention, depositing an M oxide layer in Step 808 includes depositing a silicon oxide layer with a refractive index between approximately 1.45 and 1.47.

In some aspects of the invention, depositing an M oxide layer in Step 808 includes depositing an M oxide layer in a thickness between 10 and 100 nm. It is understood that the invention is not limited to this range of thicknesses.

The following describes one possible sequence for forming a TFT using the present invention method. It is understood that other sequences also are possible for FIG. 8. For the following sequence, M is silicon. Step 801 forms a transparent substrate layer. Step 802 forms a diffusion barrier overlying the transparent substrate and underlying the silicon layer. Then, forming a silicon layer includes forming transistor channel, source, and drain regions in the silicon layer. Step 810, following the deposition of an M oxide layer in Step 808, forms a gate dielectric layer with: a fixed oxide charge density of less than $5 \times 10^{11}$ per square centimeter (/cm$^2$); an interface trap concentration of approximately $0.9 \times 10^{10}$ to $8 \times 10^{10}$ per square centimeter—electron volt (/cm$^2$ eV); a flat band voltage shift of less than 1 V; a leakage current density lower than $10^{-7}$ amperes per square centimeter (A/cm$^2$) at an applied electric field of 8 MV/cm; and a breakdown field strength greater than 10 MV/cm. Step 812 forms a gate electrode overlying the gate dielectric layer.

Figure 9:
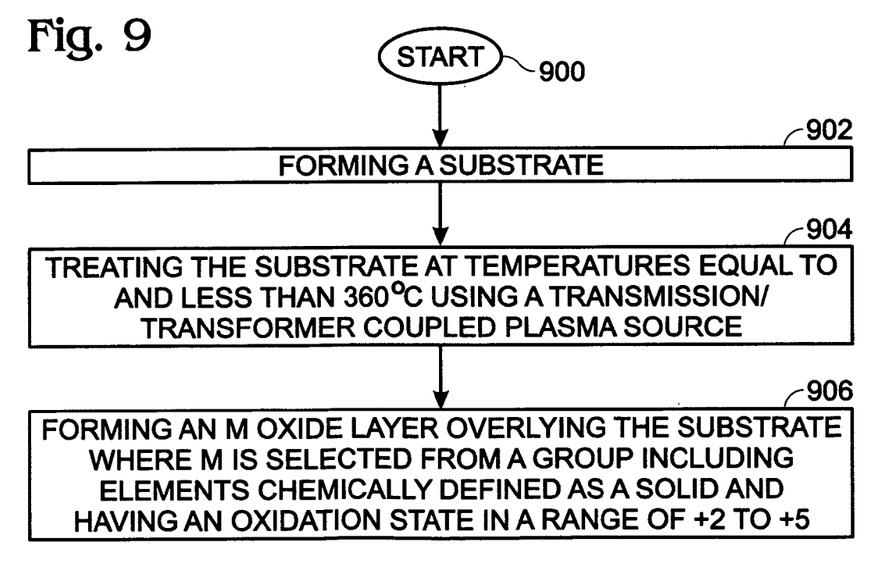
FIG. 9 is a flowchart illustrating the present invention method for fabricating M oxide thin films.

FIG. 9 is a flowchart illustrating the present invention method for fabricating M oxide thin films. The method starts with Step 900. Step 902 forms a substrate. Step 904 treats the substrate at temperatures equal to and less than 360° C. using a transmission/transformer coupled plasma (TCP) source. Step 906 forms, overlying the substrate, an M oxide layer where M is selected from a group including elements chemically defined as a solid and having an oxidation state in a range of +2 to +5. In some aspects of the invention, forming a substrate in Step 902 includes forming a substrate of silicon selected from the group including amorphous silicon, microcrystalline silicon, and polycrystalline silicon. In some aspects, treating the substrate in Step 604 includes plasma oxidizing the substrate or treating the substrate with a deposition technique. In some aspects of the invention, forming an M oxide layer in Step 606 includes forming an M oxide selected from the group including M binary oxides and M multi-component oxides.

It is understood that the descriptions for FIGS. 7 and 8 are generally applicable to FIG. 9.

Figure 10:
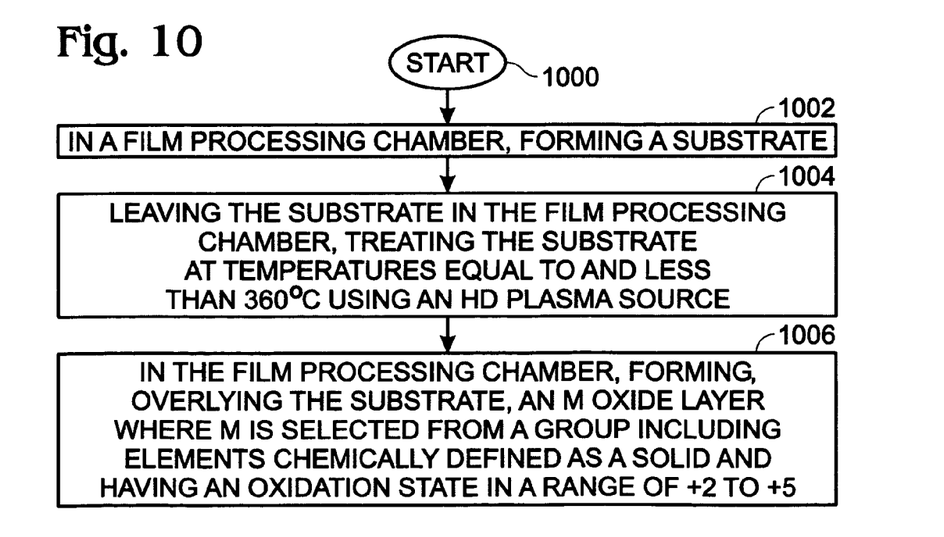
FIG. 10 is a flowchart illustrating the present invention method for in-situ fabrication of M oxide thin films.

FIG. 10 is a flowchart illustrating the present invention method for in-situ fabrication of M oxide thin films. The method starts with Step 1000. Step 1002, in a film processing chamber, forms a substrate. Step 1004, leaving the substrate in the film processing chamber, treats the substrate at temperatures equal to and less than 360° C. using an HD plasma source. Step 1006, in the film processing chamber, forms, overlying the substrate, an M oxide layer where M is selected from a group including elements chemically defined as a solid and having an oxidation state in a range of +2 to +5. Leaving in the first chamber, the substrate (Steps 1004 and 1006) means that the Steps 1004 and 1006 are performed in-situ with the previous steps, Step 1002 and 1004, respectively.

In some aspects of the invention, forming a substrate in Step 1002 includes forming a substrate of silicon selected from the group including amorphous silicon, microcrystalline silicon, and polycrystalline silicon. In some aspects of the invention, treating the substrate at temperatures equal to and less than 360° C. using an HD plasma source in Step 1004 includes using an ICP source or an ECR source. In some aspects, treating the substrate in Step 1004 includes plasma oxidizing the substrate or treating the substrate with a deposition technique. In some aspects of the invention, treating the substrate in Step 1004 includes using a TCP source. In some aspects of the invention, forming an M oxide layer in Step 1006 includes forming an M oxide selected from the group including M binary oxides and M multi-component oxides.

It is understood that the descriptions for FIGS. 7 and 8 are generally applicable to FIG. 10.

A method to fabricate a thin film M oxide has been provided. Examples have been presented using a transparent or flexible substrate. However, use of the present invention is not limited to transparent or flexible substrates. The present invention is particularly suited for use with any substrate susceptible to damage at temperatures greater than approximately 360° C. However, it is understood that the present invention is not limited to substrates susceptible to damage at temperatures greater than approximately 360° C. Examples have been presented for the formation of a TFT. However, electrical applications of the present invention are not limited to the formation of TFTs. The present invention also can be used to form M oxide layers for other electrical applications such as: diffusion barriers for discrete devices or other IC devices; and surface acoustic wave (SAW) devices. Various low frequency and high frequency discrete and integrated components, for example, resistors, capacitors, and varistors, can be fabricated on metal oxide films grown/deposited using the present invention method. Such metal oxide films have wide ranging conducting properties from insulator to semiconductor. For example, these films can be used for passivation layers or electrodes, as well as diffusion barriers.

A variety of single layer and multilayer components can be fabricated by using the present invention method. For example, a multi-layer capacitor can be fabricated by deposition and subsequent plasma oxidation of various metal layers.

M oxide films fabricated by using the present invention method can be used in photonic devices such as optical thin film filters and waveguides due to chemical stability and the wide range of refractive index characteristic of the films. M oxide films fabricated by using the present invention method also are attractive for a wide range of sensor applications, for example, chemical, biological, and micro-mechanical electrical (MEMs).

The invention has been shown using an HD-PECVD system. However, the invention method can be carried out using any HD plasma source capable of generating electron concentration higher than $10^{10}$ per cubic centimeter ($cm^{-3}$) and electron temperatures/ion energy greater than 5 electron volts (eV). That is, electron concentrations and temperatures sufficient to generate reactive oxygen species for deposition or growth of binary and multi-component oxides.

The present invention method HD plasma process can be combined with a suitable radiation source, that is, a source with a wavelength less than 300 nm to control plasma energy and density distribution. In this manner, the growth or deposition kinetics and the properties of the resulting oxides can be controlled. One example of a suitable radiation source is an excimer lamp.

Examples have been provided of some material thicknesses and of some configurations, such as a TFT. Likewise, some process specifics have been given to clearly explain the fundamental concepts. However, the present invention is not limited to just those thickness, configurations, and specifics. Other variations and embodiments of the present invention will occur to those skilled in the art.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

We claim:

1. A method for fabricating thin film oxides, the method comprising:

forming a substrate;

treating the substrate at temperatures equal to and less than 360° C., using a high density (HD) plasma source; and, forming an M oxide layer overlying the substrate where M is an element selected from a group including elements chemically defined as a solid and having an oxidation state in a range of +2 to +5, excluding silicon.

2. The method of claim 1 wherein forming the substrate includes forming a substrate including M; and, wherein using an (HD) plasma source includes using an inductively coupled plasma (ICP) source for plasma oxidizing the substrate.

3. The method of claim 2 wherein plasma oxidizing the substrate includes inductively coupling plasma:

at a temperature of 360° C.;

in a range of from 13.56 to 300 megahertz (MHz) with a power density up to 10 watts per square centimeter ($W/cm^2$);

at a pressure of up to 500 milliTorr (mTorr);

with a mixture of inert gas and oxygen in a ratio of approximately 10:1 to 200:1; and, with a total gas flow from approximately 50 to 200 standard cubic centimeters per minute (sccm).

4. The method of claim 3 wherein inductively coupling plasma includes varying a substrate bias in a range of from 50 kilohertz (KHz) to 13.56 MHz with a power density up to 3 $W/cm^2$.

5. The method of claim 3 wherein inductively coupling plasma with a mixture of inert gas and oxygen includes mixing oxygen with inert gas selected from the group consisting of helium, argon, and krypton.

6. The method of claim 3 wherein forming the substrate includes forming a silicon layer.

7. The method of claim 6 further comprising:
forming a transparent substrate layer; and,
forming a diffusion barrier overlying the transparent substrate layer and underlying the silicon layer;
wherein forming the silicon layer includes forming transistor channel, source, and drain regions in the silicon layer;
the method further comprising:
depositing a thin film of element M overlying the silicon layer;
wherein forming the M oxide layer includes forming a gate dielectric layer of the M oxide; and,
the method further comprising:
forming a gate electrode overlying the gate dielectric layer.

8. The method of claim 7 wherein forming the gate dielectric layer of the oxide includes forming a dielectric layer with:
a fixed oxide charge density of less than $5 \times 10^{11}$ per square centimeter ($/cm^2$);
an interface trap concentration of approximately from $0.9 \times 10^{10}$ to $8 \times 10^{10}$ per square centimeter-electron volt ($/cm^2 eV$);
a flat band voltage shift of less than 1 V;
a leakage current density lower than $10^{-7}$ amperes per square centimeter ($A/cm^2$) at an applied electric field of 8 megavolts per centimeter (MV/cm); and,
a breakdown field strength greater than 10 MV/cm.

9. The method of claim 3 wherein forming the substrate including M includes:
forming a base layer of a material; and,
depositing a thin film of element M overlying the base layer; and,
wherein plasma oxidizing the substrate includes plasma oxidizing the thin film of M.

10. The method of claim 1 wherein using an RD plasma source includes using an HD plasma enhanced chemical vapor deposition (HD-PECVD) process to treat the substrate; and,
wherein forming an M oxide layer overlying the substrate includes depositing the M oxide layer.

11. The method of claim 10 wherein using an HD-PECVD process to treat the substrate includes inductively coupling plasma:
in a range of from 13.56 to 300 MHz with a power density up to 10 $W/cm^2$;
at a pressure of up to 500 mTorr; and,
with a mixture of reactive gases and precursor compounds having M in a decomposable form, the reactive gases and precursor compounds in a ratio selected in accordance with the valence state of M.

12. The method of claim 11 wherein inductively coupling plasma includes varying a substrate bias in a range of from 50 KHz to 13.56 MHz with a power density up to 3 $W/cm^2$.

13. The method of claim 11 wherein forming the substrate includes forming a silicon layer.

14. The method of claim 13 further comprising:
forming a transparent substrate layer; and,
forming a diffusion barrier overlying the transparent substrate layer and underlying the silicon layer;
wherein forming a silicon layer includes forming transistor channel, source, and drain regions in the silicon layer;
wherein depositing the M oxide layer includes depositing a gate dielectric layer; and,
the method further comprising:
forming a gate electrode overlying the gate dielectric layer.

15. The method of claim 14 wherein forming a gate dielectric layer includes forming a dielectric layer with:
a fixed oxide charge density of less than $5 \times 10^{11}/cm^2$;
an interface trap concentration of approximately from $2 \times 10^{10}$ to $8 \times 10^{10}/cm^2 eV$;
a flat band voltage shift of less than 1 V;
a leakage current density lower than $10^{-7}$ $A/cm^2$ at an applied electric field of 8 MV/cm; and,
a breakdown field strength greater than 10 MV/cm.

16. The method of claim 1 wherein forming, overlying the substrate, an M oxide later includes forming an M oxide selected from the group consisting of M binary oxides and M multi-component oxides.

17. The method of claim 1 wherein treating the substrate at temperatures equal to and less than 360° C. using an HD plasma source includes using a plasma source selected from the group consisting of electron cyclotron resonance (ECR) plasma sources and cathode-coupled plasma sources.

18. The method of claim 1 wherein treating the substrate at temperatures equal to and less than 360° C., using a HD plasma source includes using a HD inductively coupled plasma (ICP) source.

19. An in-situ method for fabricating thin film oxides, the method comprising:
in a film processing chamber, forming a substrate;
leaving the substrate in the film processing chamber, treating the substrate at temperatures equal to and less than 360° C., using a high density (HD) inductively coupled plasma (ICP) source; and,
in the film processing chamber, forming, overlying the substrate, an M oxide layer where M is selected from a group including elements chemically defined as a solid and having an oxidation state in a range of +2 to +5, excluding silicon.

* * * * *